United States Patent
Moore et al.

(10) Patent No.: US 8,401,706 B2
(45) Date of Patent: Mar. 19, 2013

(54) NETWORKED MULTI-INVERTER MAXIMUM POWER-POINT TRACKING

(75) Inventors: Jackson Moore, Oakland, CA (US); William L. Erdman, Moraga, CA (US); Edward Robert Nelson, San Jose, CA (US)

(73) Assignee: ETM Electromatic, Newark, CA (US)

( * ) Notice: Subject to any disclaimer, the term of this patent is extended or adjusted under 35 U.S.C. 154(b) by 1119 days.

(21) Appl. No.: 12/230,381

(22) Filed: Aug. 28, 2008

(65) Prior Publication Data

US 2010/0052425 A1  Mar. 4, 2010

(51) Int. Cl.
*G05D 11/00* (2006.01)
(52) U.S. Cl. ...................................................... 700/286
(58) Field of Classification Search .................. 700/286, 700/287, 297, 298
See application file for complete search history.

(56) References Cited

U.S. PATENT DOCUMENTS

| | | | |
|---|---|---|---|
| 6,285,572 B1* | 9/2001 | Onizuka et al. | 363/72 |
| 6,914,418 B2* | 7/2005 | Sung | 320/140 |
| 2009/0147554 A1* | 6/2009 | Adest et al. | 363/71 |
| 2010/0253150 A1* | 10/2010 | Porter et al. | 307/82 |

* cited by examiner

*Primary Examiner* — Jeffrey A Gaffin
*Assistant Examiner* — Chad Rapp
(74) *Attorney, Agent, or Firm* — Proxigee Legal Transactions; Elizabeth Nevis, Esq.

(57) ABSTRACT

A group of solar power stations with inverters are adjusted in order to achieve optimum power output in accordance with maximum power-point tracking (MPPT). The MPPT data is used to perform adjustments. Power measurement factors, including Maximum Power Points (MPPs) are established to represent a bus-voltage setting that produces the maximum power output from an individual photovoltaic panel. These settings are established for the group so as to optimize power output under a variety of operating conditions.

33 Claims, 9 Drawing Sheets

NETWORKED MULTI-INVERTER MAXIMUM POWER-POINT TRACKING

BACKGROUND

1. Field

This disclosure relates to power control for a network of power stations. In a particular configuration, inverter power settings are performed for multiple solar panel stations.

2. Background

Solar photovoltaic systems produce electrical power. Electrical power is the product of current and voltage (I×V). Operating point and output power are interdependent in individual solar cells, and by extension in multi-cell panels and multi-panel arrays. The interdependence is characterized by a set of "I-V curves" as shown in FIG. 1. Each I-V curve has a "Maximum Power Point" (MPP). This point is the operating point (voltage and current) at which the product of the panel's voltage and current provides the highest possible power output for a given set of environmental conditions (the peaks of the curves on the lower graph of FIG. 1). In viewing FIG. 1, $MPP_{high}$ is the point on the voltage axis at which the power is maximum for the upper curve; $MPP_{medium}$ is the point on the voltage axis at which the power is maximum for the middle curve; and $MPP_{low}$, is the point on the voltage axis at which the power is maximum for the lower curve. These are illustrative graphs, but a typical value for the $MPP_{high}$ curves would be 1000 W/m² and a typical value for the $MPP_{low}$ curves would be 200 W/m². Ideally, each array of photovoltaic cells will be operating at its MPP to maximize the energy the photovoltaic system can capture. This ideal can be difficult to achieve because the I-V curve and MPP of a cell in the field is not constant.

A number of factors ("MPP factors") influence the MPP of a given cell, module, panel, or array. They include irradiance (solar radiation energy received on a given surface area in a given time), cell temperature, spectral quality, ambient temperature, age of the panel(s), zenith and azimuth position of the sun, soiling, and wind speed. FIG. 2 is an illustrative example of MPP dependence on temperature for a fixed irradiance. FIG. 3 is an illustrative example of I-V and power curves for uniform and non-uniform irradiance. The examples are given for explanation and do not depict actual test results of a particular panel.

Referring to FIG. 3, I-V curves 311 and 313 correspond to uniform and non-uniform irradiance, respectively. Power curves 321 and 323 correspond to uniform and non-uniform irradiance, respectively. MPP voltage for uniform irradiation is indicated at 331. Under circumstances of non-uniform irradiance, it is possible to have a MPP voltage at a reduced voltage and it is possible to have local MPP≠global MPP, indicated at 333.

In large scale PV systems, on the order of 100's of kilowatts to 10's or 100's of megawatts, a large number of panels or arrays of panels are used covering large ground surface areas. In these large systems, temperature-dependent losses in system components, such as wiring and transformers, also affect the MPP of the system.

Most of these factors are affected by local weather patterns, which are unpredictable and can change rapidly.

FIG. 4 is a diagram of a large solar installation with varying MPP factors for different arrays and array groups. A complication when planning large installations is that a large installation may cover variable terrain that includes hillsides, gullies, bodies of water, stands of trees, utility easements, or man-made structures. Each of these factors can affect the external MPP factors acting on nearby panels and make them behave differently from the reference. With reference to FIG. 4, array Group A's location is "ideal"—a regular grid on flat, featureless land. Array Group B may get some shade from the hill for part of the day. Array Group C is on the hill. Array Group D may be affected by the trees (transient partial shade) or the stream and lake (reflected irradiance).

Localized differences in wind speed due to different ground levels or obstructions will affect ambient and cell temperature. Thus, landscape features can cause different panels or arrays to experience differing MPP factors at any given time.

Even if the terrain is perfectly featureless, as in some plains regions, broken or moving cloud patterns can affect the MPP of the PV panels below. The more area the installation covers, the more opportunities for shifting cloud patterns or fog patches to decrease the representative accuracy of a reference. Therefore, a need exists for a scheme to operate as close as possible to the MPP tailored to the needs of large installations.

Because PV systems of the past have been relatively small, 100's of watts to 100's of kilowatts, it has been customary to attempt to keep each module, panel, or sub-array within the system independently operating at its MPP. This function, and the systems and methods that perform it, are collectively known as "Maximum Power Point Tracking" (MPPT). The MPPT function typically resides in the inverters that receive DC power produced by the PV panels and convert it to AC power. MPPT methods may be classified as predictive (based on forecasts of likely MPP) or reactive (based on real-time feedback of actual system performance). In either case, each inverter is responsible for handling the MPPT function for the PV array it is serving.

Predictive MPPT approaches set the operating point of the PV array based on a predetermined constant value (selected to represent the average MPP) or based on an algorithm that adjusts the operating point based on inputs such as time of day, actual or predicted irradiance levels, or actual or predicted cell temperature. The disadvantage of predictive MPPT is that weather-related predictions may be wrong, and the power output will be sub-optimal if unexpected weather occurs.

Reactive MPPT methods use real-time measurements of changes in power, MPP factors, or both as feedback for closed-loop control of array operating points. These allow arrays to adapt to unexpected conditions. Reactive MPPT methods include algorithms where the operating point of the array is periodically varied until the MPP is determined. The disadvantage of reactive MPPT is that the array's power output is suboptimal for considerable periods of time while the operating point is being adjusted. The disadvantage can be compounded when rapid irradiance changes, as from fast-moving broken clouds, prolong hunt time; the MPP is a moving target while the I-V curve is changing with irradiance. The disadvantage can also be aggravated for partially-shaded arrays with "lumpy" I-V curves having multiple local maxima, an example of which is depicted in FIG. 3; the system may settle on a local MPP that is not the global MPP. Finally under quickly changing irradiance conditions, MPPTs often force the array to operate on the unstable portion of the I-V curve, which is the region beyond the peak operating point where power can drop off very quickly and the closed loop tracking system can become unstable.

"Reference" reactive MPPT methods track the MPP of a representative sample, rather than on each module, panel, array, or other independently controllable unit. The operating points of the other modules, panels, or arrays are then set to the sample's MPP. The disadvantage is that the representative sample is never completely representative due to the sample's size and differences in the MPP factors between the sample and the actual PV array. Reference MPPT schemes tend to mitigate the fluctuation problems; the larger the array, the less the reference cell's MPPT operations affect total output power. In applying this technique, the larger the number of panels in an installation, the greater the chance for error due to variability in the cell, panel or array manufacturing process. Increased geographical coverage of an installation results in increased variation in external MPP factors that the PV panels may experience. Both of these factors may compromise the accuracy of reference cells in tracking MPP for large arrays.

SUMMARY

Large-scale PV systems present opportunities for each inverter-connected array in the system to operate at or near its MPP using information from other arrays in the system. In a multi-unit, networked system of PV inverters, this approach sets the operating point of one or more inverters based on an MPP established elsewhere in the network. The "operating point" may be adjusted by adjusting voltage, current, or both. Unlike the reference MPPT methods of the prior art, it is possible to use a reference that is not a permanently fixed separate cell or sub-array, but an inverter-controlled array that may be selected dynamically with changing external conditions so that it always represents, with acceptable accuracy, the most representative sample. In large systems, there may be multiple representative references (hereinafter, a "master") each used to set the operating point of other inverter-controlled arrays. Compared to the prior-art approach of each inverter-controlled array performing independent MPPT, the technique is able to increase plant energy capture and reduces fluctuations in the delivered power. Compared to fixed-reference MPPT, this ensures that the reference is optimally chosen for the prevailing external conditions.

DESCRIPTION OF THE DRAWINGS

The features and nature of the present disclosure will become more apparent from the description set forth below and the drawings, in which like reference characters identify correspondingly throughout and wherein:

FIG. 6A (prior art) is a diagram of a representative building block for a large scale PV system.

FIG. 6B (prior art) is a diagram of a large PV system typical of conventional installations where MPPT functions are performed at each inverter.

FIG. 6C (prior art) is a diagram of representative building blocks for a large scale PV system capable of network communications.

FIG. 6D is a diagram of a large PV system with the addition of a data network that connects each inverter to each other and indicating that some inverters perform their own MPPT function while other inverters operate at the MPP point of another inverter. In this embodiment, the master/slave relationships can be assigned by any node on the network or by each inverter individually.

FIG. 6E is a diagram of a large PV system with the addition of a CCU (central control unit) added to the data network. In this embodiment, the CCU can make master/slave associations based on data from inverters.

FIG. 6F is a diagram of a large PV system where the CCU is making MPP decisions for each inverter.

DETAILED DESCRIPTION

Overview

Figure 1:
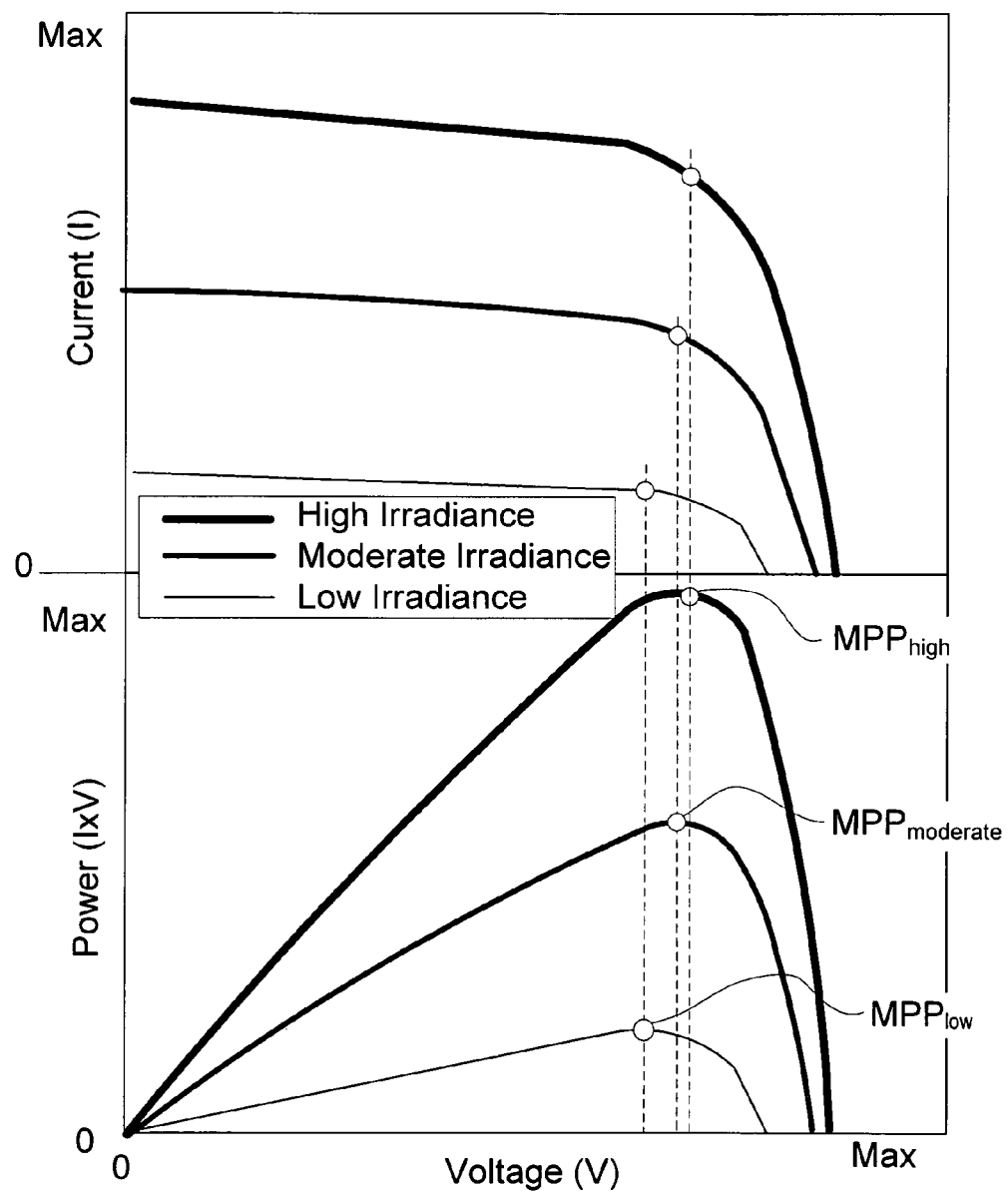
FIG. 1 is a graphical representation of operating point verses power and current in a PV array for high and low irradiance circumstances.
Figure 2:
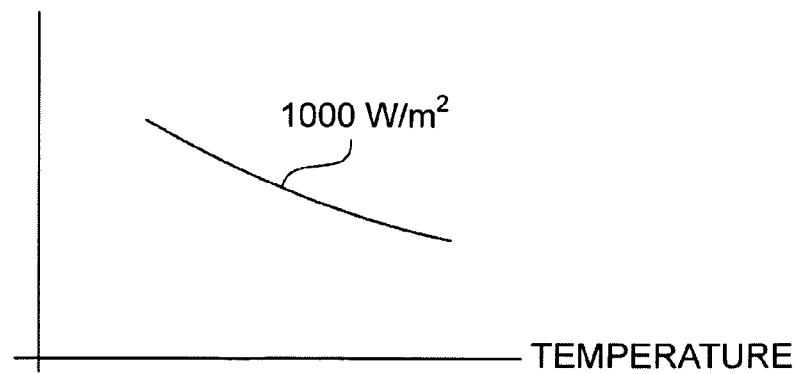
FIG. 2 is a graphical representation of operating point at a fixed irradiance for varying cell temperatures
Figure 3:
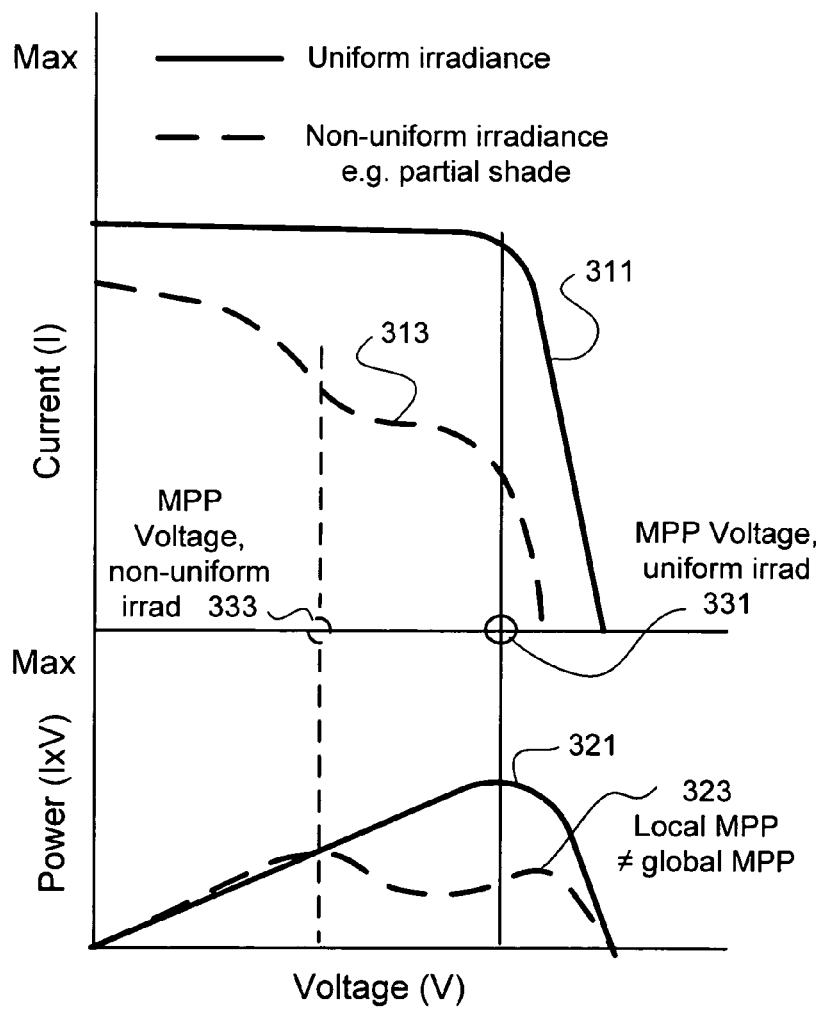
FIG. 3 is a graphical representation of operating point vs. power and current in a non-uniform-shading example of irradiance showing multiple peak power points.
Figure 4:
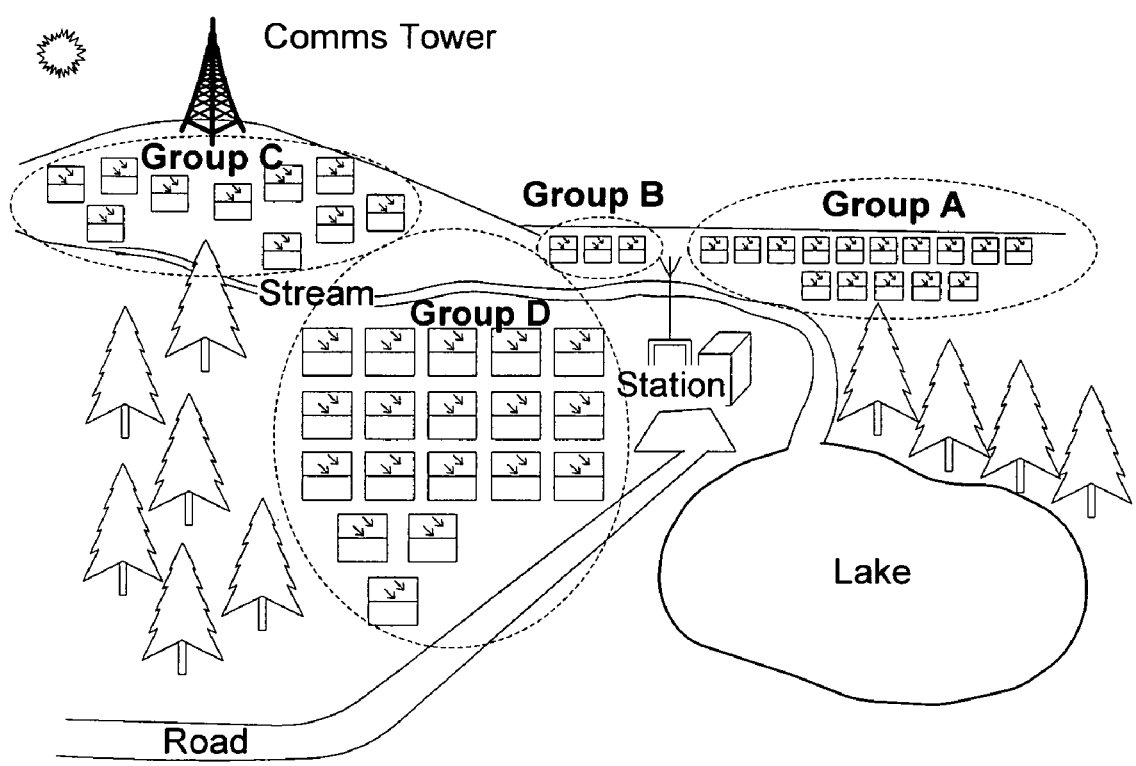
FIG. 4 is a diagram of a large solar installation with varying MPP factors for different arrays and array groups.

In a multi-inverter system, groups of arrays will often share similar internal and external factors that affect their MPP. The inverters are connected to a common communication network. Each inverter is capable of operating as a "master" that performs maximum power-point tracking (MPPT) for its own array, or as a "slave" that sets its operating point to match another inverter in the network. If only the master inverters need to perform MPPT when MPP factors change, while the slaves simply adjust their operating point to match their assigned masters, the total energy capture of the system will increase.

While a "common communication network" is described, it is understood that multiple networks within the meaning of the Open Systems Interconnection Basic Reference Model (OSI Model) at the OSI Network Layer and Transport Layer can be used. When connected through a device, such multiple networks can constitute a single "network" because control or communication is initiated at one device and received at another device. By way of example, a "common communication network" can include groups of inverters connected to separate networks that connect with a common CCU or networked group of CCUs.

In larger scale PV systems, on the order of 100's of kilowatts to 10's or 100's of megawatts, a large number of panels or arrays of panels are used covering very large ground surface areas. In some cases this could be on the order of 80,000 acres, by way of example. In these large systems, temperature-dependent losses in system components, such as wiring and transformers, also affect the MPP of the system. In these types of systems there are MPPT opportunities that cause the larger scale system to operate at or near its MPP using information from other PV systems in the local area. These large scale MPPT systems that rely on communication from adjacent PV systems have the ability to capture more energy than a large number of independently running MPPTs that operate independently from each other.

The control and peak power tracking of large scale PV plants using multiple arrays and inverters is accomplished by looking at the power levels of identified master arrays. Communication between the various arrays then allows for other arrays within the PV plant to track the master array.

Control of a power network having multiple power generating stations is achieved by use of maximum power-point (MPP) data or other power-related data. Power measurement factors from at least a subset of power stations in the power network are compared, and the data and comparison of the data is used to generate power measurement factor comparison data. The power measurement factor comparison data is used in tracking the data, for example by performing Maximum Power-Point Tracking (MPPT), with the MPPT based on the power measurement factor comparison data to provide. In the case of MPPT tracking, MPPT adjustments are made based on the MPPT data.

Maximum Power Point Adjustments

As mentioned, the Maximum Power Point (MPP) is the point on the IV curve which results in the maximum power. The MPP has a corresponding current and voltage. The inverter controls the bus voltage. In a perturb-and-observe algorithm (a reactive MPPT method), it adjusts the voltage, measures the output and repeats.

The described techniques adapt aspects of reference and other MPPT methods to large installations by taking advantage of the multiple inverters typical of large installations. The described techniques are particularly useful for large installations where the system is composed of tens or hundreds of inverters. In the described techniques, each inverter can operate as a "master" (reference) that uses an algorithm to track its own MPP, or as a "slave" that periodically adjusts its operating point to match its assigned master's. A wide variety of embodiments are feasible, differing from each other by (1) how inverters are selected to operate as masters or slaves, (2) which devices in the network perform the master/slave selection, (3) what data the selection is based on and how it is collected, and (4) how the selections are communicated to the affected inverters.

Selection of inverters to operate as masters or slaves can be done in several ways. Each master and its slaves can be manually selected by a user, or automatically selected by an algorithm. Selection criteria can include the relative physical location of the arrays in the system, the panels' ages or test results, or MPP factor data sensed in real time.

Connecting the multiple inverters through a network enables installation-wide mapping of MPP factors for each inverter's array at any given time. The mapping, combined with stored data, can identify groups of arrays that are "similarly situated" (i.e., subject to similar MPP factors). Within these groups, the "most average" member of the group can be identified and assigned to operate as a master until the MPP factors change. The mapping and use of the resulting information is an aspect that adds intelligence to the use of the existing MPPT methods. The "MPP factor space" in which the inverters are mapped can have as many dimensions as there are measured and stored MPP factors available: for instance, a very simple space could have one dimension, such as physical location or measured irradiance, or a complex MPP factor space could include many measured and stored factors. In MPP factor space, near-neighbor inverters are identified and their "distance" from each other compared to a pre-determined error margin. For example, if several inverters form a cluster in MPP-factor space, the inverter closest to the center may be selected as master, and the others within the error margin of the master may be selected as its slaves.

Figure 5A:
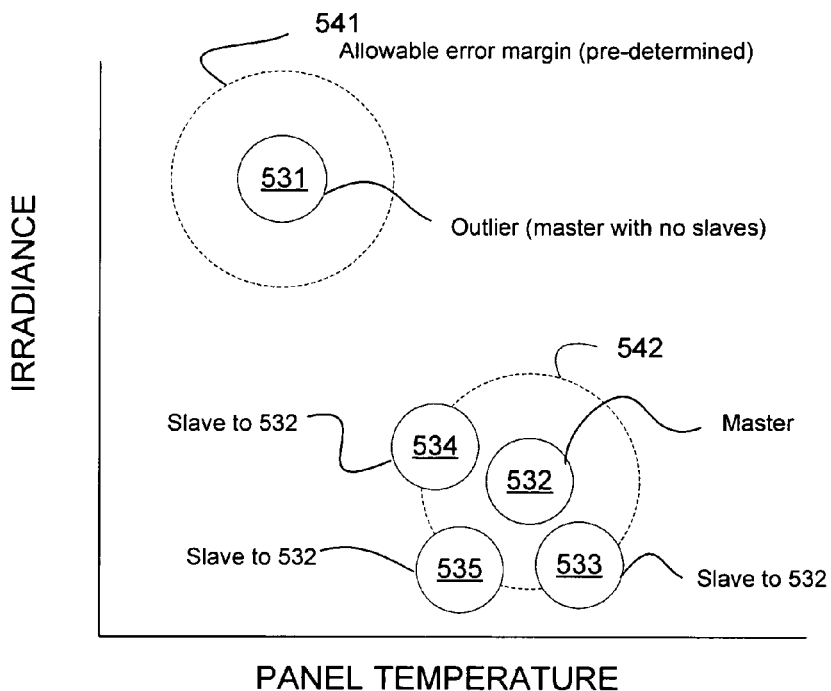
FIG. 5A is a diagram of an example of a two-dimensional MPP space with inverters mapped and masters and slaves assigned according to a predetermined error margin.

FIG. 5A is a diagram of an example of a simple two-dimensional MPP space with inverters mapped and masters and slaves assigned. Other MPP factors can also become dimensions in MPP-factor space. Such other MPP factors can include factors sensed in real time, or factors retrieved or calculated from stored data. Retrieved and calculated factors include panel batch characteristics, panel age, panel location, solar zenith and solar azimuth, all of which can become dimensions in MPP-factor space.

Depicted in FIG. 5A are a plurality of inverters, represented as 531, 532, 533, 534 and 535. By defining and plotting predetermined error margins around each inverter, e.g., 541, 542 around inverters 531, 532, a model consistent with electrical performance of these network components can be generated and used. Alternatively, referring to the relative positions of the inverters 531-535 on the graphs of FIG. 5, inverters 531-535 can be described in terms of space as defined by the axes of the graph. This space defined by the axes of the graph can be interpreted as MPP factor space. It is noted, that, while the error margins are shown here as dotted circles for simplicity, they may have any suitable shape. Typically, the error margins will often not be rotationally symmetric because each axis is a different MPP factor measured in different units, and the positive and negative error-margin widths may also be unequal.

Inverters 533, 534, and 535 are controlled as slaves to inverter 532, which is the most centrally located of the group. Inverter 531 is an outlier, beyond the error margin of any of the inverters 532, 533, 534, and 535. Therefore it is assigned to operate independently of the other inverters as a master. Because no other inverters are within 531's error margin 541, inverter 531 is not assigned any slaves.

The algorithm may provide contingencies for scenarios where master/slave assignments might be unclear, as for example:

1. When a cluster spans more than one allowable error margin, grouping the inverters in a cluster so that the smallest number of inverters are masters and no slave follows another slave.
2. When a cluster spans more than one allowable error margin, reducing the error margin to more clearly isolate the inverter clusters.
3. Deciding which inverter is the master if none are clearly closest to the center of a group.
4. Periodically allowing each inverter to determine its own MPP to determine if significant shading exists. When shade is affecting one array, its MPP may be significantly different than another array even when all other MPP factors are identical. In this manner, the shade factor can be determined and added as a dimension in MPP factor space (shade may be affecting some arrays nearly equally, but significantly differently from others).

Figure 5B:
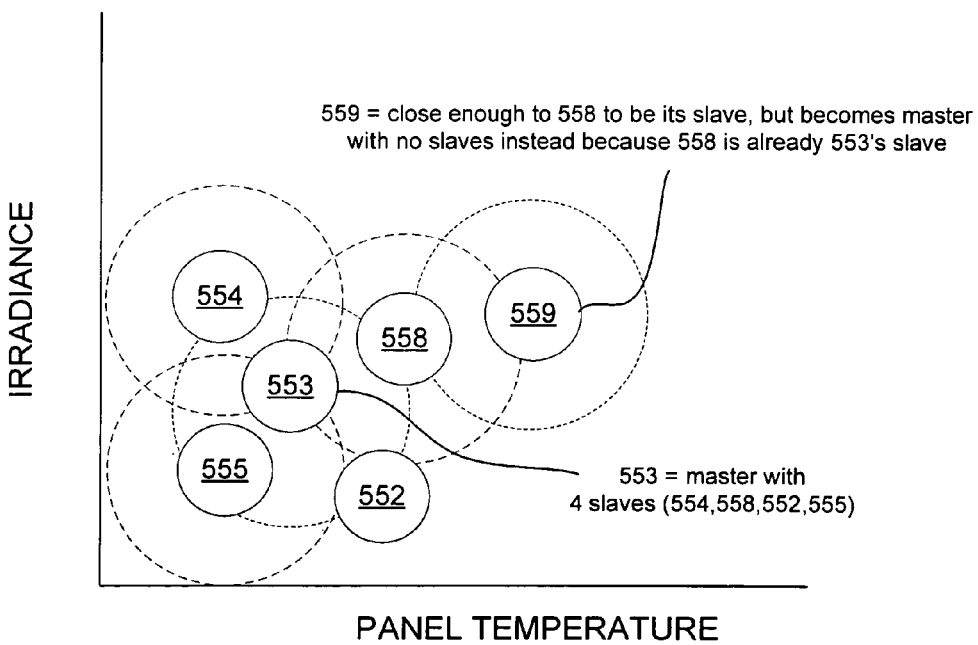
FIG. 5B is a diagram of an example of a two-dimensional MPP-factor space, with inverters mapped and error margins plotted, showing an error-proofing algorithm in action to prevent inverters from inappropriately becoming slaves of other slaves.

FIG. 5B is a diagram of an example of a simple two-dimensional MPP-factor space, with inverters 552, 553, 554, 555, 558 and 559 mapped and error margins plotted, illustrating these contingencies. Assume that inverter 553 functions as a master for inverters 552, 554, 555 and 558. Inverter 559 is close enough to inverter 558 to be its slave. A contingency measure may be included in the algorithm to prevent this. Preventing 559 from slaving to 558 is advantageous because inverter 558 is already a slave to inverter 553. Therefore, slaving 559 to 558 would effectively slave 559 to 553, which would be inappropriate because 559 and 553 are outside each other's error margins. A similar contingency measure can be included in the algorithm to choose which inverter operates as the master when none of them are uniquely centered in a cluster—for example, when only two inverters lie within each other's error margin, both are equidistant from the center, but only one should be a master.

FIG. 5B also illustrates how an optional feature of the algorithm can examine alternative master/slave groupings to choose the arrangement that minimizes the number of masters, which may be one way to maximize plant-wide efficiency and power stability. For instance, in Grouping 1 (shown by the circles with shorter dashes), 553 could be assigned as master of 552, 554, 555, and 558 (which lie within 553's error margin); that would leave 559 (outside 553's error margin) as a master with no slaves, therefore Grouping 1 would have 2 masters. Alternatively, in Grouping 2 (shown by the circles with longer dashes), inverter 558 could be assigned as master of 552, 553, and 559 (which lie within 558's error margin). However, 554 and 555 are not within 558's error margin, nor are they within each other's, so Grouping 2 would require that they both operate as masters, resulting in a total of 3 masters for Grouping 2. Therefore, an algorithm capable of analyzing the choices and choosing the most advantageous under predetermined criteria can improve overall plant performance.

The selection of masters and slaves may be implemented anywhere on the network. A central control unit (CCU), such as a supervisory control and data acquisition (SCADA) system can select masters and slaves ("centrally controlled" embodiments). SCADA is only given as an example of central control, and it is possible to use different central control schemes and other non-central control schemes. Alternatively, processing components integrated in the inverters themselves may determine whether each inverter operates as a master or slave, independently of whether the network includes a CCU ("self-directed" embodiments).

The data to be applied to the networked-MPPT algorithms, which determine the selection of masters and slaves, can be collected in several ways. In a centrally controlled embodiment, a CCU may read MPP factors from inverters (e.g. present operating point & master/slave status), from array sensors (e.g., irradiance, temperature) or from storage (e.g. age, physical location). Some centrally-controlled or self-directed embodiments may use a CCU to collect the data and rebroadcast it to receiving components in the inverters; this is especially useful where several separate inverter networks communicate with the same CCU. In other self-directed embodiments, where all the inverters in a group of interest are connected by the same network, receiving components in the inverters may read the data sent to the CCU by other inverters and array sensors, and use it to make their own determination on whether to operate as masters or slaves. In still other self-directed embodiments, where all the inverters in a group of interest are connected by the same network, receiving components in the inverters may read MPP factor data broadcast by other inverters and array sensors onto the network whether or not the network includes a CCU.

Unlike prior-art reference MPPT systems, the assignment of masters and slaves need not be permanent. Master/slave assignments can be re-evaluated at regular intervals and changed if a change would be advantageous (result in higher energy capture). Alternatively, the re-evaluation may be event-driven: that is, a change in power output or sensed MPP factors may trigger a re-evaluation.

When a master/slave determination is made or changed for a given inverter, the implementation of that decision can be done in several ways. In a centrally-controlled embodiment, the CCU can issue a command to each inverter. In self-directed embodiments, processing components in the inverter can issue and carry out the commands, based on data collected through the CCU or directly from other inverters and array sensors in a "peer-to-peer" arrangement.

"Peer-to-peer" in this sense refers to how master/slave status and/or MPP factors can be communicated between inverters. The specific technique for communicating MPP and MPP factors depends on whether peer-to-peer or central control is used. Variations include:

1. Inverters make the master/slave decision (self-directed embodiment) and communicate their status and MPP factors to other inverters in a peer-to-peer manner. No CCU is needed; however, a CCU can optionally be used in this arrangement.
2. The CCU makes the master/slave decision in a centrally-controlled embodiment, but the actual control of MPP is effected by the designated masters. In this arrangement, the master inverters send their updated MPP to their slaves in a peer-to-peer manner.

Inverters operating as masters may perform MPPT by any suitable algorithm, including variations on predictive and reactive MPPT methods. Once a master has found its new MPP, its assigned slaves set their operating points to match the master's. To minimize fluctuations in power delivered to the grid, additional algorithms resident in either a CCU or on the individual inverters may provide for sequences and delays to ensure that only one, or a few, different master inverters are hunting for a new MPP (which involves varying the inverter's power output) at any given time and to stagger slave operating point changes.

Figure 6A:
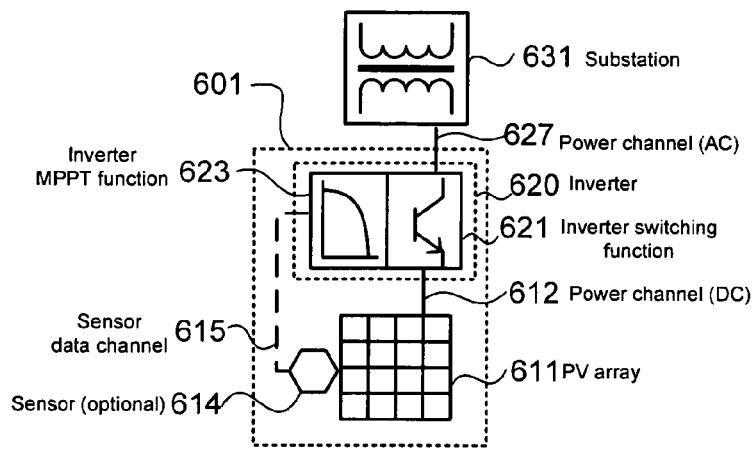
FIGS. 6A-F are flow diagrams showing the control operation for sets of panels.
Figure 6B:
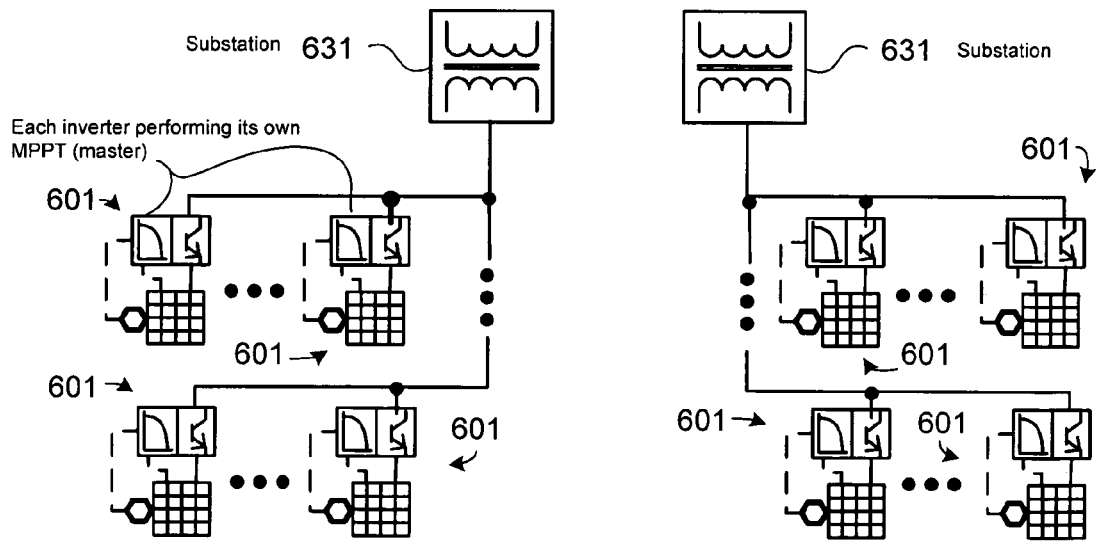
Figure 6C:
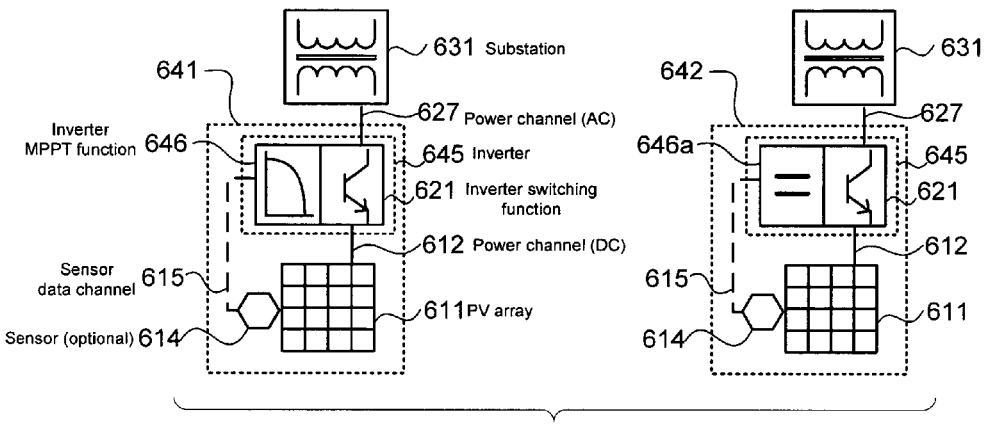
Figure 6D:
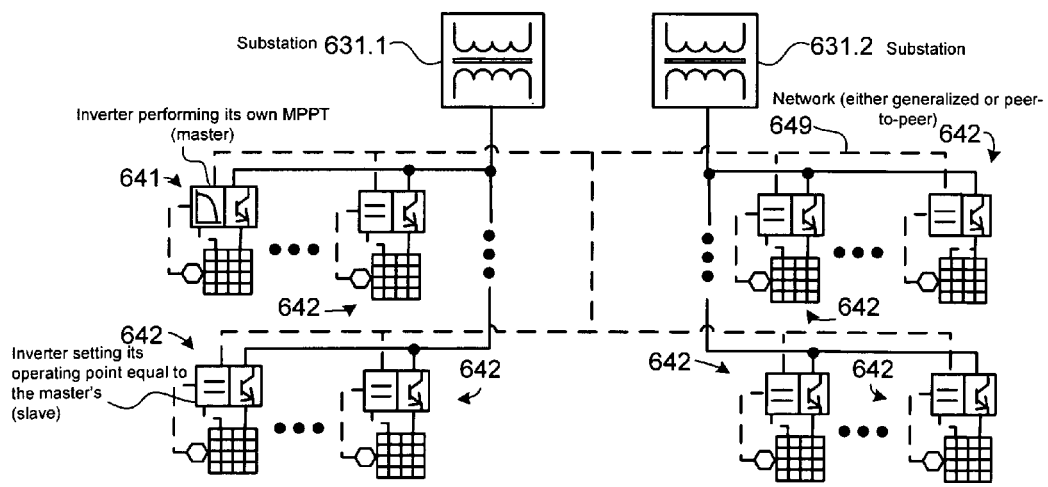
Figure 6E:
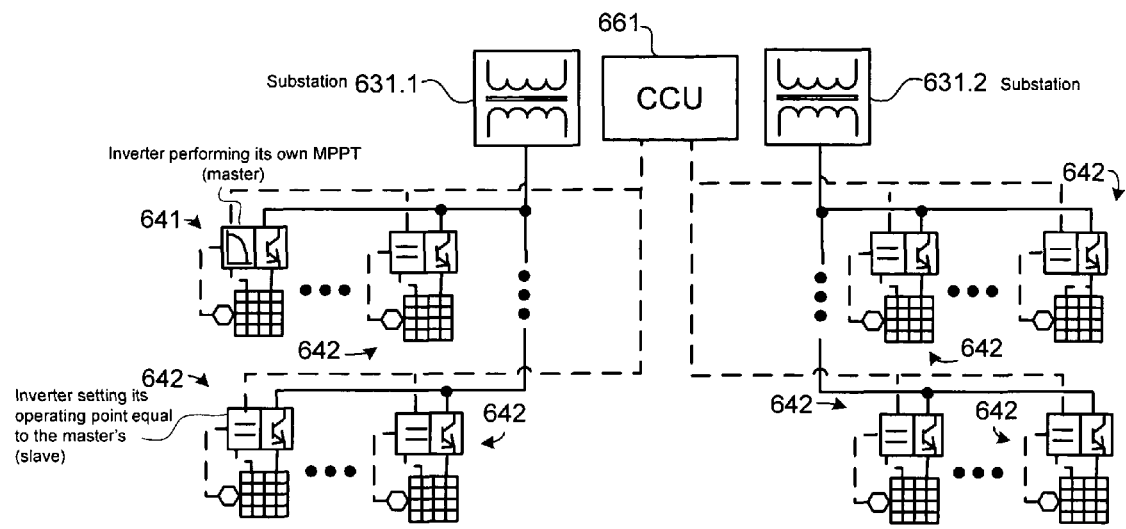
Figure 6F:
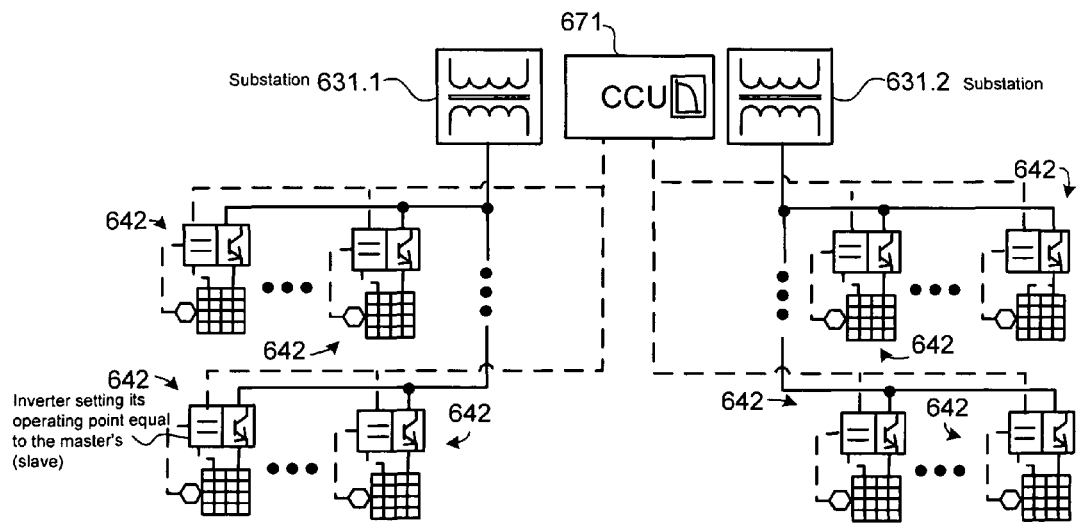

FIGS. 6A-F are diagrams showing the control operation for sets of panels. FIG. 6A is a diagram of a representative building block for a large scale PV system. FIG. 6B is a diagram of a large PV system typical of conventional installations where MPPT functions are performed at each inverter. FIG. 6C is a diagram of representative building blocks for a large scale networked PV system. FIG. 6D is a diagram of a large PV system with the addition of a data network that connects each inverter to each other and indicating that some inverters perform their own MPPT function while other inverters operate at the MPP point of another inverter, and are assigned by any node on the network or by each inverter individually. FIG. 6E is a diagram of a large PV system with the addition of a CCU (central control unit) added to the data network, in which the CCU can make master/slave associations based on data from inverters. FIG. 6F is a diagram of a large PV system where the CCU is making MPP decisions for each inverter.

FIG. 6A is a simplified "building block" illustrating the basis for the more complex system diagrams to follow. The solid lines are power channels, and the dotted lines are communication channels. Power station 601 includes PV array 611, DC power channel 612, optional sensor 614, sensor data channel 615, and inverter 620. Inverter 620 includes the inverter circuit module, which is identified as inverter switching function 621, and a control module, identified as inverter MPPT function 623. The inverter circuit module 621 provides an inverter output through power output channel 627 to substation 631. PV array 611 delivers DC power through array power output channel 612 to inverter switching function 621. Inverter 621 converts the array's DC power to AC power, which it delivers through inverter power output channel 627 to power substation 631. Optionally, a sensor system 614 may measure external MPP factors affecting array 611 and send them through sensor data channel 615 to inverter MPPT function 623 (represented by a symbolic I-V curve). Array 611, inverter switching function 621, inverter MPPT function 623, optional sensor 614, and channels 612, 615 that connect them together comprise power station 601.

FIG. 6B demonstrates the prior art, in which each inverter performs MPPT independently for its own array; that is, every inverter acts as a master.

FIG. 6C is a simplified "building block" illustrating the basis for the more complex system diagrams to follow. The solid lines are power channels, and the dotted lines are communication channels. Power stations 641, 642 each include PV array 611, DC power channel 612, optional sensor 614, sensor data channel 615, and inverter 645. Inverter 645 includes the inverter circuit module, which is identified as inverter switching function 621, and a control module, identified as inverter MPPT function 646. Inverter 645 provides an inverter output through power output channel 627 to substation 631. Additionally, the inverter control module is capable of interacting with other inverter control modules in different inverters 645 to permit control as a master (in power stations 641) or slave (in power stations 642). PV array 611 delivers DC power through array power output channel 612 to inverter switching function 621. Inverter switching function 621 converts the array's DC power to AC power, which it delivers through inverter power output channel 627 to power substation 631. Optionally, a sensor system 614 may measure external MPP factors affecting array 611 and send them through sensor data channel 615 to inverter MPPT function 646. Array 611, inverter switching function 621, inverter MPPT function 646, optional sensor 614, and channels 612 and 615 that connect them together comprise power stations 641, 642.

The inverter can function a master, depicted as inverter 645 in power station 641, or a slave, depicted as inverter 645 in power station 642. Inverter 645 in power station 641 functioning as a master performs MPPT functions for that array, as determined by control module 646. Inverter 645 in power station 642 functioning as a slave performs power point adjustments for that array as determined externally by a master (e.g., by control module 646 of inverter 645 in power station 641). Therefore, if the control module is in a slave mode, as represented at control module 646a in power station 642, that control module 646a is responsive to an external control module. It is possible for a slave control module to have the capability to function as a master when no other suitable master is available.

FIG. 6D shows the general case, in which inverter MPPT functions interact (sending, receiving, or both) with generalized inverter communication network 649. Power stations 641 and 642 on the data network have a master/slave assignment. Many variations on the nature of inverter communication network 649, and on the information sent or received by inverter MPPT function 646, are possible. Each of the following example approaches to networked MPPT (NMPPT) technique uses the networking of inverters to assign some of the inverters to operate as slaves to appropriate masters. Some may use the network to map the inverters in MPP-factor space, and use the map to choose the optimal number of masters. Several variations on this theme could be implemented:

Centrally Controlled NMPPT: A central control unit (CCU) 661, which may be, by way of non-limiting example, a supervisory control and data acquisition (SCADA) system, is included. The CCU is part of the network and performs some of the functions. FIG. 6E illustrates a centrally controlled embodiment. The network can operate in either of the following ways:
  a. Inverters send their measurements to the CCU, where other, non-measured MPP factors reside. The CCU periodically recalculates the MPP-factor map, assigns inverters to master or slave status, and sends a command to each slave inverter with its new commanded operating point.
  b. Same as a. above (inverters send their measurements to the CCU), except the inverters can read each other's operating point through the network, so slaves can follow their masters through multiple MPPT cycles until the CCU assigns them to different masters or commands them to become masters.

In centrally-controlled embodiments where a CCU is present, the CCU itself may perform maximum power point tracking for specific inverters or for the system as a whole and communicate commanded operating points to each inverter. In this example, all inverters are slaves of the CCU.

FIG. 6F shows an alternate embodiment where CCU 671 includes an internal MPPT function and the inverters are, in effect, slaved to the CCU. The MPPT resides in CCU 671 (represented by a symbolic I-V curve), and all inverters "slave" to CCU 671, based on the internal MPPT function. The CCU may determine, as shown here, a single MPP for all the inverters; alternatively, it may determine a set of MPPs for each inverter separately or for multiple subgroups of inverters.

Self-Directed NMPPT: Inverters analyze their own MPP factors and those of other inverters to make their own master/slave decisions.
  a. Inverters send their measurements to the CCU, but the CCU only rebroadcasts the measurements to all the inverters, appending any non-measured MPP factors. Each inverter analyzes the positions of its neighbors in MPP factor space and makes its own decision whether to function as a master or a slave. The CCU rebroadcast is useful when not all the inverters are on the same network.
  b. Inverters connected as in FIG. 6E send their measurements and non-measured MPP factors to the CCU while reading what all (or some) of the other inverters are sending. Inverters make their own master/slave decisions based on their readings. The CCU only monitors the data for use in performance evaluation or sending maintenance alerts.
  c. The CCU does not participate in the NMPPT process and need not even be part of the network (as in a literal, rather than symbolic, interpretation of the network in FIG. 6D). Inverters broadcast their measurements and non-measured MPP factors to each other and make their own master/slave decisions.

Control Configurations

Figure 7:
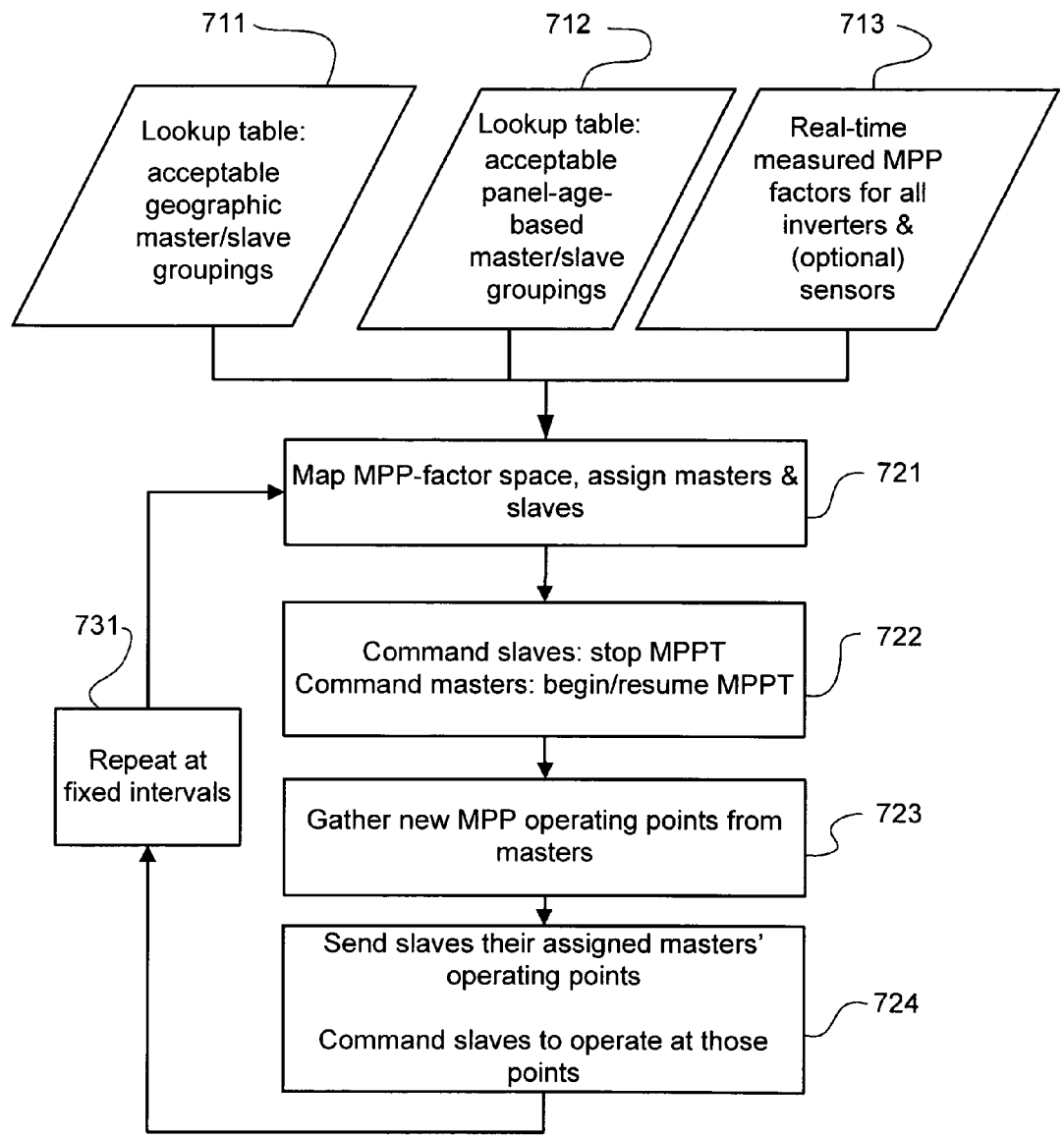
FIG. 7 is a diagram indicating a typical flow diagram for a centrally controlled embodiment evaluating MPP factors and making master/slave assignments.
Figure 8:
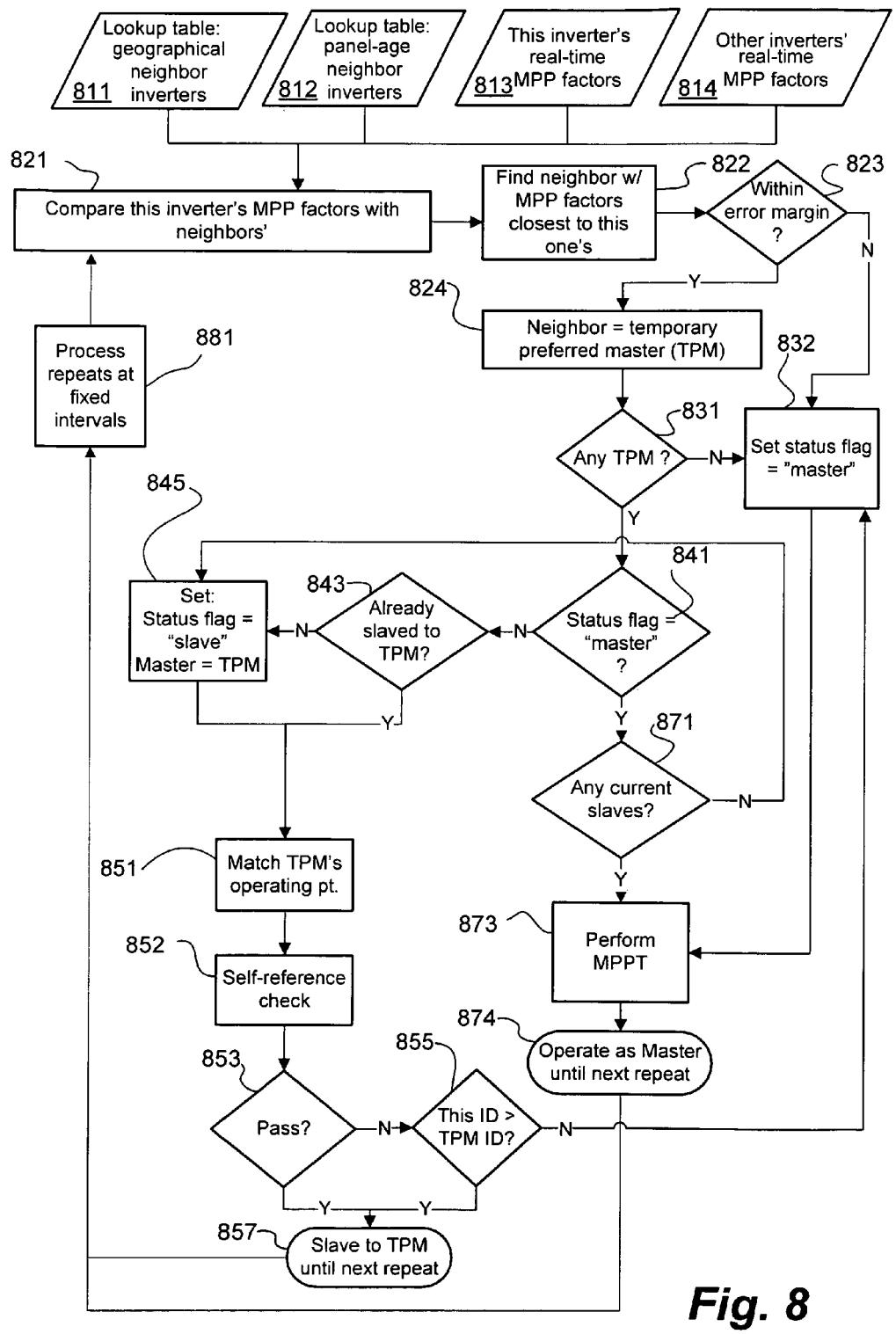
FIG. 8 is a diagram indicating a typical flow diagram for a self-directed embodiment where each inverter is evaluating MPP factors and making its own master/slave determination.

FIGS. 7 and 8 are example control configurations for a plurality of arrays.

FIG. 7 is a flowchart of an example algorithm for a centrally-controlled configuration, showing the process that can take place in the CCU. This configuration is an example of an algorithm in which a CCU maps MPP-factor space and commands slaves to set their operating points based on MPP data read from assigned masters. Appropriate master/slave assignments are sorted by the algorithm to ensure that masters and slaves are of similar age and are similarly situated geographically, as well as having similar real-time measured MPP factors (MPP factor space mapping).

Information 711-713 regarding MPP factors is obtained. The information includes information 711 in the form of a lookup table regarding acceptable geographic master/slave groupings, information 712 in the form of a lookup table regarding acceptable panel-age-based master/slave groupings, and real-time measured MPP factors 713 for all inverters, including information from sensors. The sensors may be optical sensors, thermal sensors, and other types of sensors. The information is used to map MPP-factor space and assign masters & slaves (step 721). Commands are then issued (step 722) to the slaves and masters, in which the slaves stop MPPT and the masters begin or resume MPPT. New MPP operating points are gathered from the masters (step 723). The operating points from the masters are then sent to the slaves (step 724) and the slaves operated at those operating points. In any of these configurations, any suitable MPPT method may be used by the assigned master inverters or the CCU, including the presently known methods of predictive, reactive and reference MPPT.

The process is repeated at fixed intervals (step 731).

FIG. 8 is a flowchart of an example algorithm for a self-directed configuration, showing a process that can take place within each inverter. In any of these configurations, any suitable MPPT method may be used by the assigned master inverters or the CCU, including the presently known methods of predictive, reactive and reference MPPT.

Information 811-814 regarding MPP factors is obtained. The information includes information 811 in the form of a lookup table regarding geographical neighbor inverters, information 812 in the form of a lookup table regarding panel age of neighbor inverters, the subject inverter's real-time MPP factors 813 and other inverters' real-time factors 814. The information is used to compare (step 821) the subject inverter's MPP factors with MPP factors of its neighbors. The particular neighbor having MPP factors closest to those of the subject inverter is identified (step 822) and a determination (step 823) is made of whether the MPP factors of the closest neighbor is within an error margin.

In the case of the MPP factors of the closest neighbor is within the error margin, the neighbor is made the temporary preferred master (TPM, step 824) and a determination (step 831) is made as to whether a TPM was found. In the case of MPP factors of the closest neighbor not being within the error margin, or in the case of there being no TPM, the subject inverter is set as the master and a master flag is set to "Master" (step 832).

If a TPM exists (determination step 831), a determination is made whether the inverter is already a master (existing status flag is already set to "Master", step 841), and if not, a determination (step 843) is made whether the subject inverter is slaved to the TPM. If the subject inverter is not slaved to the TPM, the status flag of the subject inverter is set to "Slave" and the master is the TPM. In either case, meaning the subject inverter is slaved to TPM (determination 843) or the status flag is already set to "Slave" (step 841,3), the result is the same, meaning the subject inverter is slaved to the TPM and the status flag set to "Slave". A match is made (step 851) of the TPM's operating point, and a self-reference check (to prevent multiple inverters from slaving to each other) is performed (step 852). A determination (step 853) is made of whether the self reference check passed.

In the case of the self reference check not passing (determination 853) a determination (step 855) is made of whether the subject inverter's ID is greater than the TPM ID. If the subject inverter's ID is greater than the TPM ID (determination 855), then the subject inverter is slaved to the TPM until the next repeat of the sequence. The determination of whether the subject inverter's ID is greater than the TPM ID is a very basic self reference algorithm. This sequence is given as an example of a self-reference algorithm, and is not intended to exclude other techniques.

If the subject inverter's ID is not greater than the TPM ID (determination 855), then the status flag is set to master (step 832).

In the case of the status flag already being set to "Master" as determined at determination 841, a determination (step 871) is made of whether there are any current slaves, and if not, the inverter is allowed to slave to the TPM (step 845). If the determination (at step 871) is that there are current slaves, MPPT is performed (step 873) and the subject inverter is operated as a Master until the next repeat of the sequence.

MPPT is also performed (step 873) in response to setting of the master flag to "Master" (step 832).

The process repeats at fixed intervals (step 881) by returning to the comparing of the subject inverter's MPP factors with MPP factors of its neighbors at step 821.

These possible, but not essential, enhancements can work with several variations, non-limiting examples being:

Predictive operation: Extra storage and analysis capability is added to either the CCU or the inverters so they can use MPP-factor map history to predict what will happen next, reducing lag time between MPP changes and inverter voltage corrections. For instance, a moving cloud will cause a traveling ripple in irradiance across adjacent arrays. The speed and direction of the ripple can be measured, and the next arrays in the path will adjust for it as (instead of after) it reaches them.

Predictive MPPT approaches set the operating point of the PV array based on a predetermined constant value or based on an algorithm that adjusts the operating point based on inputs such as time of day, actual or predicted irradiance levels, or actual or predicted cell temperature. One predictive MPPT approach is the "optimized fixed voltage" method, where each panel or array is operated at the fixed operating point that will stay nearest the MPP over the course of an "average day"; the fixed operating point can be determined by models or sets of previous measurements. Another predictive MPPT approach is voltage scheduling, where a timer changes the array operating point by increments based on expected MPP changes as time goes by. Advanced voltage-scheduling algorithms can account for cell age as well as expected daily and seasonal irradiance and temperature changes.

Peer-to-peer communication: While master/slave relationships last, masters communicate their MPP changes and MPP factors directly to all their slaves, speeding up responses and simplifying processing. Slaves periodically monitor the general MPP-factor traffic and decide whether to become slaves to another master or become masters themselves.

Manual overrides:
a. An operator can assign some inverters to always be masters, and the rest to be slaves to whichever master is closest in MPP space.
b. An operator can prevent inverters from becoming slaves to certain other inverters (for instance, those geographically too far away, or pointing at a different angle, or still being "burned in" after installation.). A "No Follow Flag" may be used in order to keep other inverters from slaving to an inappropriate master.
c. An operator can assign a sequence or delay between masters performing MPPT so that only one or a few masters are doing so at any given time. This confines the power fluctuations associated with the MPPT process to a small fraction of the total power produced by the installation at any given time.

Automatic Override by Inverter: It is possible to permit the inverter to override the CCU in instances where a MPP factor exceeds a predetermined threshold. In centrally controlled embodiments, where a master is performing MPPT on its respective array, but the polling frequency from the CCU is such that the inverter may perform several MPPT operations between CCU polls, the inverter can initiate a message to the CCU if a deadband threshold is exceeded between MPPT operations. In such instances, the CCU could initiate recalculation of MPP factor space. By way of example, if the deadband threshold is exceeded from one MPPT operation to another to initiate recalculation of MPP factor space and/or immediately direct slaves to begin operating as their own masters.

Software Implementation

The operation and control features can be implemented in hardware, software or a combination of hardware and software. In the case of software, the software may be embodied in storage media or as firmware. Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, data signals, data transmissions, or any other medium which can be used to store or transmit the desired information and which can be accessed by the computer. Based on the disclosure and teachings provided herein, a person of ordinary skill in the art will appreciate other ways and/or methods to implement the various embodiments.

Conclusion

It will be understood that many additional changes in the details, materials, steps and arrangement of parts, which have been herein described and illustrated to explain the nature of the described technique, may be made by those skilled in the art within the principal and scope of the invention as expressed in the appended claims.

The invention claimed is:

1. A method of controlling a group of power generating stations, each of the power generating stations comprising a DC power source supplying power to an inverter, the method comprising:
connecting a plurality of inverters to a communications network;
transmitting maximum power point (MPP) data over the network;
determining, from the MPP data, whether to operate any of the inverters as a slave inverter, and
upon assigning an inverter to operate as a slave inverter, setting or changing an operating point of the slave inverter responsive to the MPP data transmitted on the network.

2. The method of claim 1, further comprising:
dynamically selecting one of said inverters to function as a master in accordance with predetermined criteria for a representative sample of similarly situated inverters; wherein
functioning as a master comprises MPP tracking.

3. The method of claim 2, further comprising:
the inverters mapped according to said predetermined criteria;
in the case of the mapping resolving to a mapped cluster of said inverters that spans more than one allowable error margin, reducing the error margin to more clearly isolate the mapped cluster.

4. The method of claim 2, further comprising
setting an operating point of at least one slave to the MPP tracked by the master.

5. The method of claim 1, further comprising:
comparing MPP factors or MPP data from at least a subset of power generating stations to generate comparison data; and
adjusting the operating point of the inverter operating as a slave based on the comparison data.

6. The method of claim 5, wherein:
the DC source comprises photovoltaic panels;
the MPP data comprises a bus-voltage setting that produces a maximum power output from an individual photovoltaic panel; and
adjusting the operating point compensates for variation in MPP factors.

7. The method of claim 1, further comprising:
comparing MPP factors or MPP data from at least a subset of power generating stations to generate comparison data;
dynamically selecting a representative one of said power generating stations to function as a master based on the comparison data;
causing the master to execute an MPP tracking algorithm; and
setting the operating point of the slave inverter to the MPP tracked by the master.

8. The method of claim 7, wherein:
photovoltaic panels comprise the DC source in at least a subset of the power generating stations;
the MPP data comprises an operating point that produces a maximum power output from an individual photovoltaic panel; and
the MPP tracking provides adjustments for variation in at least one MPP factor.

9. The method of claim 7, wherein:
photovoltaic panels comprise the DC source in at least a subset of the power generating stations;
the MPP data comprises an operating point that produces a maximum power output from an individual photovoltaic panel; and
the MPP factor comprises irradiance near the photovoltaic panel.

10. The method of claim 1, further comprising:
comparing MPP factors or MPP data from at least a subset of power stations to generate comparison data;
using photovoltaic panels as the DC source in at least a subset of the power generating stations;
using a bus-voltage setting that produces a maximum power output
from an individual photovoltaic panel as part of the MPP data;
storing at least one MPP factor;
retrieving the stored MPP factor;
measuring at least one real-time MPP factor;
using the stored MPP factor and the real-time MPP factor to perform maximum
power-point tracking (MPPT).

11. The method of claim 1, further comprising:
comparing MPP factors or MPP data from at least a subset of power generating stations in the power network to generate comparison data;
using photovoltaic panels as the DC source in at least a subset of the power generating stations;
using a bus-voltage setting that produces a maximum power output from an individual photovoltaic panel as part of the MPP data;
storing at least one MPP factor;
retrieving the stored MPP factor; and
measuring at least one real-time MPP factor;
wherein using the stored MPP factor and the real-time MPP factor to perform maximum power-point tracking (MPPT) provides adjustments for variation in MPP factors over time.

12. The method of claim 1, further comprising:
setting the operating point of one or more inverters associated with the power generating stations based on maximum power points (MPPs);
mapping the inverters in MPP-factor space;
selecting an optimal grouping of masters and slaves according to predetermined criteria; and
re-evaluating and, if appropriate, reassigning masters and slaves either at fixed intervals or when measured MPP factors change by more than a threshold amount.

13. The method of claim 1, further comprising:
setting the operating point of one or more inverters associated with the power generating stations based on maximum power points (MPPs);
mapping the inverters in MPP-factor space;
selecting an optimal grouping of masters and slaves according to predetermined criteria, including a minimum number of masters; and
re-evaluating and, if appropriate, reassigning masters and slaves either at fixed intervals or when measured MPP factors change by more than a threshold amount.

14. The method of claim 13, further comprising in the case of the mapping resolving to a mapped cluster of said inverters that spans more than one allowable error margin, reducing the error margin to more clearly isolate the mapped cluster.

15. The method of claim 1, further comprising:
comparing MPP factors or MPP data from at least a subset of power generating stations to generate comparison data; and
using an operating-point setting that produces a maximum power output from an individual power generating station as part of the MPP data.

16. The method of claim 15, further comprising:
performing maximum power-point tracking (MPPT) on inverter outputs of the power generating stations;
selecting the slave inverter to operate in response to a master inverter MPPT, and
selecting the master inverter from a group of inverters having MPP factors within a predetermined variance from the slave inverter.

17. The method of claim 1, wherein the operating point is transmitted over the network from a central control unit.

18. The method of claim 1, further comprising:
performing maximum power-point tracking (MPPT) on inverter outputs of the
power generating stations;
using a central control unit to adjust the operating point of the slave inverter
based on a result of the MPPT;
monitoring power produced by the slave inverter, and
in the event that the slave varies from a maximum power point (MPP)factor,
causing the slave inverter to override the control from the central control
unit and operate as a master.

19. The method of claim 1, further comprising:
performing maximum power-point tracking (MPPT) on inverter outputs of the
power generating stations; and
using peer-to-peer control to change the operating point of the slave inverter
based on a result of the MPPT.

20. The method of claim 1, further comprising:
performing maximum power-point tracking (MPPT) on inverter
outputs of the power generating stations; and
setting or changing the operating point of the slave inverter based on a predicted result of the MPPT.

21. The method of claim 1, further comprising:
tracking at least one MPP factor for at least one power generating station;
setting an operating point for the power generating station;
monitoring at least one sensor associated with the station, the sensor detecting at
least one of power, irradiance, and temperature;
determining whether a reading from the sensor represent a change
from a previous reading; and
in the case of the reading changing from the previous reading, effecting an adjustment in the operating point.

22. A method of controlling a power generating station within a group of power generating stations, the method comprising:
tracking at least one MPP factor for the power generating station;
identifying a corresponding MPP factor for at least one neighbor power generating station;
comparing the MPP factors or MPP data of the power generating station and the neighbor power generating station;
based on the compared MPP factors or MPP data, operating the power generating station as a master or as a slave;
wherein having
a master performs MPP tracking, and
a slave sets its operating point to the master's most recently tracked MPP.

23. The method of claim 22, further comprising:
monitoring at least one sensor associated with the station, the sensor detecting at least one of power, irradiance, and temperature;
determining whether readings from the sensor represent a change from a previous reading; and
in the case of the reading changing from the previous reading, effecting an adjustment in the operating point.

24. The method of claim 22, further comprising:
setting the operating point of one or more inverters associated with the power generating stations based on maximum power points (MPPs); and
re-evaluating and, if appropriate, reassigning masters and slaves either at fixed intervals or when measured MPP factors change by more than a threshold amount.

25. The method of claim 24, further comprising:
setting the operating point of one or more inverters associated with the power generating stations based on maximum power points (MPPs);
mapping the inverters in MPP-factor space;
selecting an optimal grouping of masters and slaves according to predetermined criteria, including a minimum number of masters; and
re-evaluating and, if appropriate, reassigning masters and slaves either at fixed intervals or when measured MPP factors change by more than a threshold amount.

26. The method of claim 25, further comprising in the case of the mapping resolving to a mapped cluster of said inverters spans more than one allowable error margin, reducing the error margin to more clearly isolate the mapped cluster.

27. A method of controlling a power generating station within a group of multiple power generating stations, the method comprising:
selecting MPP factors or MPP data;
reading the selected MPP factors or MPP data;
searching a data-store for a previous reading of the selected MPP factors or MPP data;

upon finding a previous reading, computing a difference between the reading and the previous reading and comparing the difference with an allowed margin;

in the case of the difference exceeding the allowed margin, or finding no previous reading, searching for another power generating station with similar MPP factors or MPP data;

in the case of locating another power generating station with similar MPP factors or MPP data, establishing one of the power generating stations as a slave; and in the case of not locating another power generating station with similar MPP factors or MPP data, establishing the power generating station as a master.

28. The method of claim 27, wherein the readings comprise inverter maximum power point (MPP) readings.

29. Control apparatus for a group of power generating stations, comprising:
a circuit module capable of comparing MPP factors or MPP data from at least a subset of power stations to generate comparison data;
a circuit module capable of selecting a master inverter based on the comparison data and causing the master inverter to perform MPP tracking; and
a circuit module capable of adjusting an operating point of a slave inverter based on the MPP tracked by the master.

30. Control apparatus for a group of multiple power generating stations, comprising:
means for comparing MPP factors or MPP data from at least a subset of power stations to generate comparison data;
means for performing maximum power-point tracking (MPPT) based on the comparison data to provide MPPT data; and
adjustment means for performing MPPT adjustments based on the MPPT data.

31. The control apparatus of claim 30, further comprising:
means for monitoring at least one MPP factor from a power station in the subset;
means for determining whether the monitored MPP factor results in an MPP variation greater than a margin threshold; and
means for causing the power station to override control from a central control unit and track its own MPP if the MPP variation is greater than the margin threshold.

32. A computer program product, comprising:
a non-transitory computer-readable medium comprising:
a first instruction for causing a computer to compare MPP factors or MPP data from at least a subset of power stations in a group to generate comparison data;
a second instruction for causing the computer to select one of the power stations to temporarily operate as a master, cause the master to perform maximum power-point tracking (MPPT), and collect resulting MPP data; and
a third instruction for causing the computer to determine whether efficiency of the group would improve by operating another power station as a slave to the master, and if so, adjusting an operating point of the slave based on the MPP data.

33. The computer program product of claim 32, further comprising a fourth instruction for causing the computer to re-evaluate and, if appropriate, reassign masters and slaves either at fixed intervals or when measured maximum power point (MPP) factors change by more than a threshold amount.

* * * * *